United States Patent [19]
Erickson et al.

[11] Patent Number: 6,121,546
[45] Date of Patent: Sep. 19, 2000

[54] RF SHIELD

[75] Inventors: Maria M. Erickson, Dublin, Ohio; Richard G. Witty, Kinnelon, N.J.

[73] Assignee: Lucent Technologies Inc., Murray Hill, N.J.

[21] Appl. No.: 09/063,228

[22] Filed: Apr. 20, 1998

[51] Int. Cl.[7] .................................................... H05K 9/00
[52] U.S. Cl. ............................. 174/35 R; 174/35 GC; 174/52.3; 361/752; 361/736; 361/399; 361/816; 361/818
[58] Field of Search ................. 174/35 R, 35 GC, 174/52.2; 361/752, 736, 399, 400, 816, 818

[56] References Cited

U.S. PATENT DOCUMENTS 5,250,751  10/1993  Yamaguchi ..................... 174/35 GC
5,354,951  10/1994  Lange et al. ..................... 174/35 R
5,559,676   9/1996  Gessaman ........................... 361/752
5,895,884   4/1999  Davidson .......................... 174/35 R

*Primary Examiner*—William A. Cuchlinski, Jr.
*Assistant Examiner*—Ronnie Mancho

[57] ABSTRACT

An RF shield dividing components on a printed circuit board into separate compartments in the form of a divider wall having a lower edge surface soldered onto the printed circuit board and an upper edge surface including along the length thereof a plurality of adjacent upwardly extending metal Y-fold arms as a self-contained or built-in gasket to physically contact and electrically ground a metal cover section enclosing the components.

11 Claims, 4 Drawing Sheets

RF SHIELD

BACKGROUND OF THE INVENTION

1. Field of the Invention

This invention relates to RF (radio frequency) shields, and more particularly, to such RF shields as are oftentimes incorporated in electrical apparatus employed in the communications industry.

2. Description of the Related Art

RF shields are frequently used to reduce interference and cross-talk in amplifier apparatus, such as might be found inside a cell site of a cellular communication system. In fact, several such shields may often be employed between adjacent circuits and systems to effectively compartmentalize the apparatus into separate operating units. The electrical apparatus is typically arranged with a printed circuit board and its electrical components positioned in a bottom section of a housing. An overlying cover section includes one or more of these RF shields as internal walls extending downwardly from the underside of the cover to separate the printed circuit board components into individual compartments. Once the wall alignment is in place, appropriate RF gaskets are glued to the bottom edges of these walls, or clipped to them (as with a bead of computer-fed plastic polymer material). The overlying cover is then screwed or clamped-down to the printed circuit board in conventional manner.

While such RF shielding, and the electrical apparatus which operates with such shielding in place, performs adequately well, the overall set-up process has been analyzed to be time consuming and labor-intensive. For example, common fabrication follows the taking of a block of aluminum, and machining it to make a prototype of the cover section with the number of divider walls required, then testing it. Even if no modifications are needed to the design, the usual next step is to proceed to a plaster casting—which could still be changed relatively easily and inexpensively if further testing shows that modifications are desirable. Once a design proves out electrically, the next step is to proceed to a die cast operation. Then, after final testing and approval, a mold is made,—which comprises a substantial portion of the cost of the part itself. If all has gone well, the RF gaskets are glued or otherwise secured to the bottom of each divider wall, before the cast cover section is screwed down, or clamped to the bottom section. Experience has shown that this process, even where all goes well, can take upwards of 15 weeks or more to complete.

SUMMARY OF THE INVENTION

As will become clear hereinafter, the RF shield of the invention utilizes the shielding gasket as part of the divider wall which separates the electrical apparatus into individual compartments. In accordance with a preferred embodiment of the invention, the internal divider wall includes upper and lower edge surfaces—with the lower edge surfaces soldered to the printed circuit board in the bottom section of the electrical apparatus enclosure, and with the upper edge surfaces including a plurality of adjacent, upwardly extending Y-fold arms of a length to physically contact the underside of the cover section of the housing. With the upwardly extending Y-fold arms being of a metal composition which deflect against the underside of the cover section as it is placed onto the housing, thereby grounding the arms, the Y-fold arms effectively provide the RF gasket function automatically, as the housing is closed.

In the preferred embodiment of the invention described, such Y-fold arms, and such inner divider wall, are secured to an inside surface of a surrounding fence which includes a plurality of tab locators to align the divider wall in position. With the printed circuit board itself having a plurality of apertures around its surface, these tab locators are positioned, to pass through the apertures—where they may be secured, as by soldering, to the printed circuit board with its components in place, or by nature of a press or interference fit between the board and the tab locators. This results in the internal divider wall becoming an integral part of the printed circuit board as it is placed in desired position on the board, to receive the overlying cover which downwardly deflects the Y-fold arms in forming the RF gasket. By providing a press, or interference fit between the surrounding fence and the overlying cover section, the housing is effectively secured.

With this embodiment of the invention, the overall RF shielding which results will be appreciated to be obtainable through a machine metal stamping operation—in which the bottom and cover sections, and the internal divider wall with its self-contained or built-in RF gasket, can all be fabricated from steel, and then tin-plated or with any appropriate solderable material. Thus, not only is the separate use of an RF gasket avoided, along with the need for securing it in position, but the need for casting the internal divider walls to form separate compartments is avoidable as well. As will be appreciated, it is such gasket/wall design used in conjunction with the cover that leads to the RF shield of the invention.

BRIEF DESCRIPTION OF THE DRAWINGS

These and other features of the present invention will be more clearly understood from a consideration of the following description, taken in connection with the accompanying drawings, in which:

FIGS. 4a and 4b are helpful in understanding a manner of closing the cover section of the apparatus of FIG. 3a.

DETAILED DESCRIPTION OF THE INVENTION

Figure 1A:
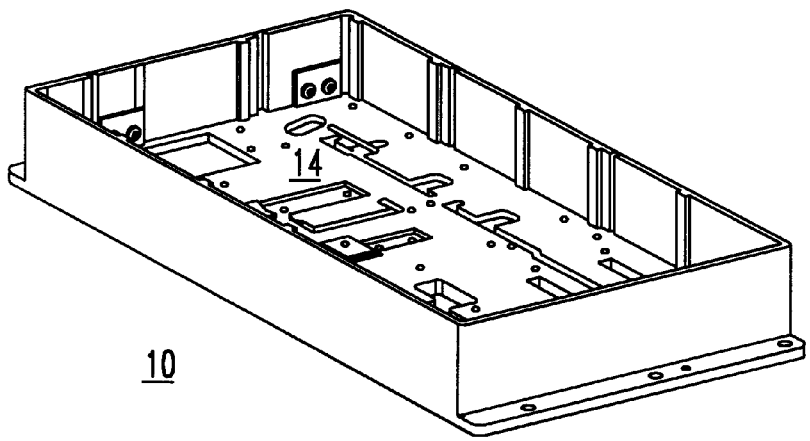
FIGS. 1a–1c are trimetric views helpful in an understanding of prior art manners of forming internal divider walls as RF shields utilizing a casting process.
Figure 1B:
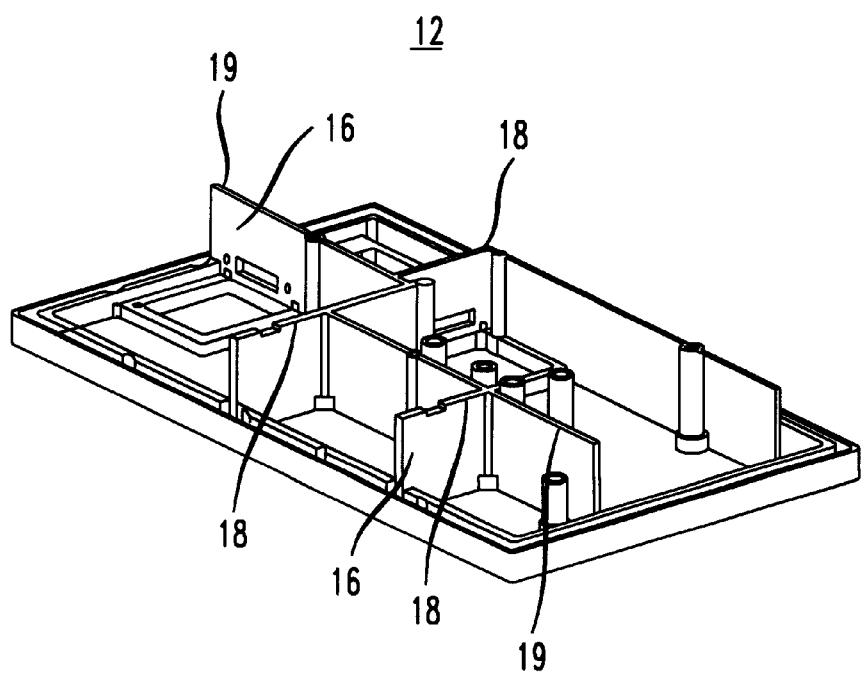
Figure 1C:
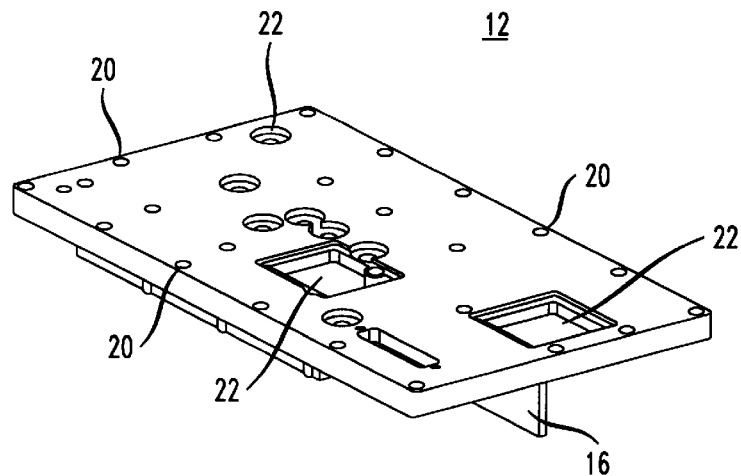

In FIGS. 1a–1c, a typical electrical apparatus is shown of the type including a bottom section 10 to be closed by an overlying cover section 12. Within the bottom section 10, a printed circuit board 14 is secured, the components of which are to be shielded from electrical interference and/or cross talk by a plurality of internal divider walls extending from the underside of the cover section 12. (FIG. 1b, in this respect, represents the cover of FIG. 1c rotated into the plane of the paper 180°.) Such internal divider walls 16 are typically constructed of 80–125 mil thickness aluminum, obtained by a die cast operation.

In use, the bottom edges 19 of the walls 16 are provided with an RF gasket 18—glued or clipped thereto, and of a thickness to bear against the printed circuit board 14 when the cover section 12 (in the orientation of FIG. 1c) is pressed to close the bottom section 10 of FIG. 1a. Reference numerals 20 in FIG. 1c identify various screw-type holes, for example, for securing the cover section 12 to the bottom section 10, while reference numerals 22 identify openings in the cover section 12 through which individual ones of the components on the printed circuit board 14 extend.

As previously mentioned, with the teachings of the present invention, the separate attachment of these RF gaskets 18 are avoided, and the labor intensive acts of securing the bottom and cover sections 10, 12 are reduced. As will be appreciated, the necessity of die-casting the individual divider walls 16 is eliminated as well.

Figure 2A:
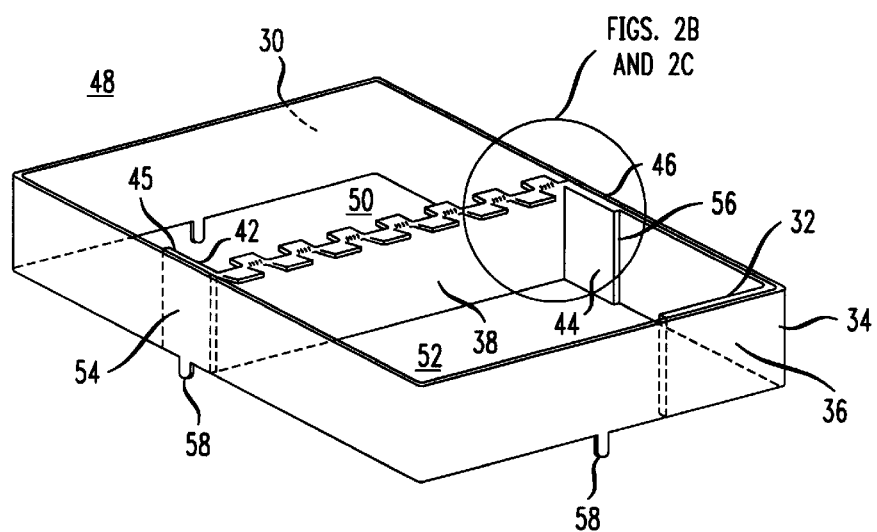
FIGS. 2a–2c are views of an RF shielded compartment constructed according to the present invention.
Figure 2B:
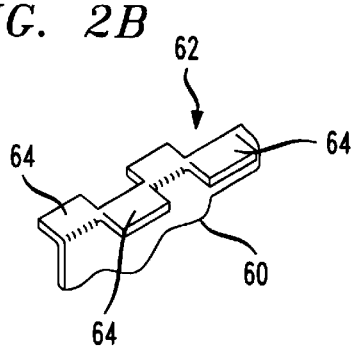
Figure 2C:
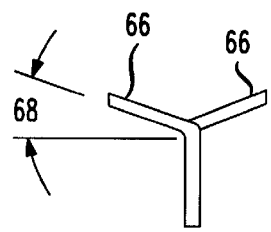

Thus, in FIGS. 2a–2c, a length of tin-plated steel or other metal 30 is stamped into any desired configuration, with ends 32, 34 overlapping and secured—as by spot welding 36—into a surrounding fence (FIG. 2a). An internal divider wall 38 of like material is shown having opposing side edges 42, 44 secured—similarly as by spot welding—at inside surfaces 45, 46 of the surrounding fence 48. (For configurations of electrical apparatus having more than the two compartments 50, 52 of FIG. 2a, additional like secured internal divider walls may be spot welded into position, as in the arrangement of FIG. 1b.) The two spot welds for the divider wall 38 of FIG. 2a are shown at 54, 56. Tab locators 58 extend downwardly from the fence 48 to fit within, and extend through, a plurality of apertures on the printed circuit board (of FIG. 1a), so as to facilitate the positioning of the wall 38.

Figures 4A, 4B:
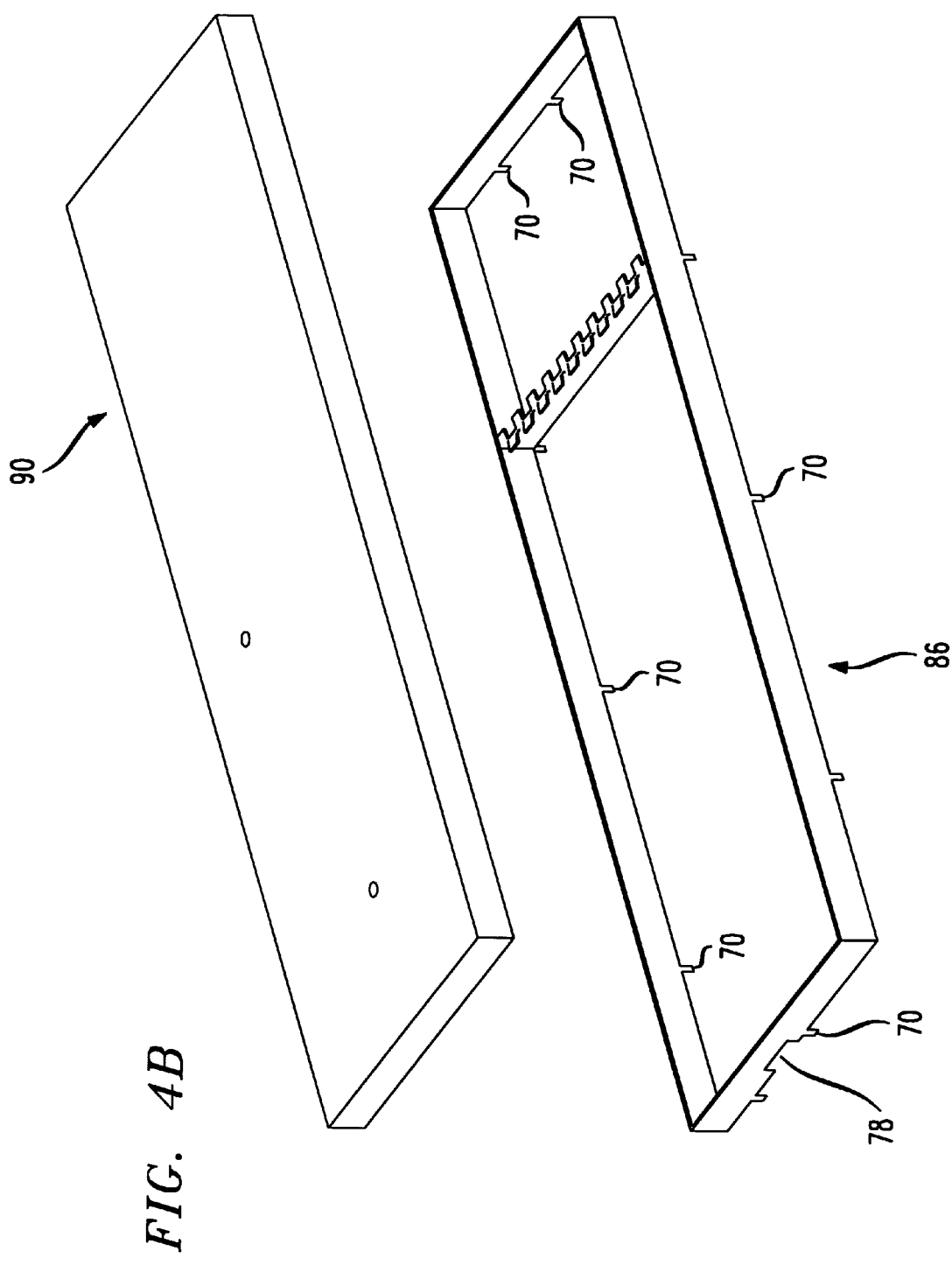

In accordance with the invention, the internal divider wall 38 is provided with a lower edge surface 60 to be soldered onto the printed circuit board 14 once the tab locators 58 are extended through the apertures in the board receiving them. The divider wall 38 also has an upper edge surface 62, including a plurality of adjacent, upwardly extending Y-fold arms 64 of a length to physically contact the underside surface of a cover section to be pressed over the surrounding fence 48 in closing the apparatus (FIGS. 4a and 4b). FIG. 2b illustrates an exploded view of the Y-fold arms 64, while FIG. 2c illustrates the Y-fold arms 64 as having two sections 66, which extend upwardly at an angle 68—for example, 5°–15° measured from the horizontal. In accordance with the invention, the Y-fold arm sections 66 are of a metal composition which downwardly deflect from the force imparted through placement of a cover to close the bottom section 10. With the Y-fold arms 64 continuing to press against the underside of the cover due to the resulting spring-like action of the sections 66, the divider wall 38 is grounded and RF shielding occurs.

Figure 3A:
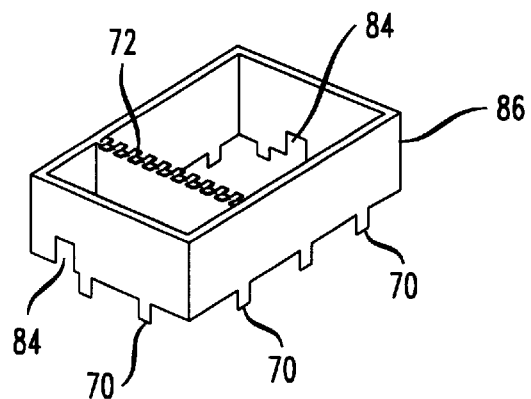
FIGS. 3a–3b are views helpful in an understanding as to how the RF shield of the invention can be utilized in an electrical amplifier apparatus.
Figure 3B:
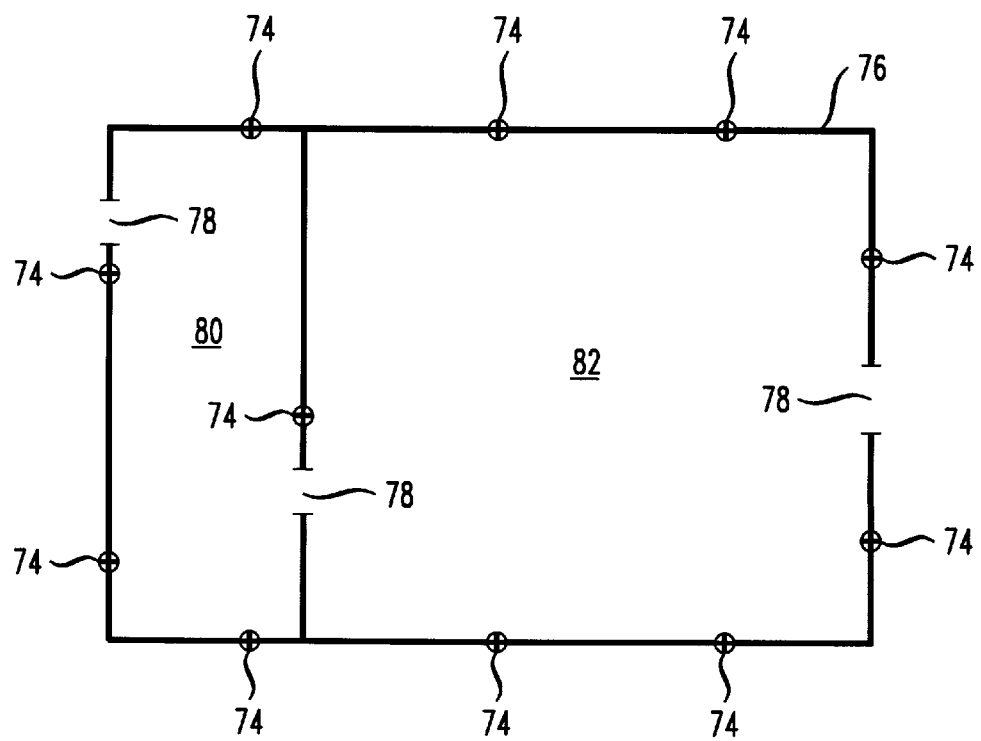

FIGS. 3a and 3b respectively illustrate a perspective view of the RF shield, and a top-view layout of a printed circuit board for receiving such shield. The tab locators of the RF shield 75 are shown at 70, and are positioned to fit within the apertures 74 on the printed circuit board 76. The openings 78 on the printed circuit board 76 allow for the passing of electrical wiring into, and out from the board 76, and between the components in the two compartments 80, 82. Like openings 84 are cut into the surrounding fence 86 and in the divider wall 72. As indicated in this use of the invention, ten apertures 74 are provided in the printed circuit board 76 to receive a like number of tab positioners 70 extending from the surrounding fence 86. In a preferred construction, the tab locators 70 are selected of a length to extend through the apertures 74 and the fence 86 is then soldered at its base to a stenciled solder pad on the board while being run through a re-flow oven, to be secured in conventional manner.

FIGS. 4a and 4b show, in 180° rotated view, the surrounding fence 86 and the tab locators 70 and opposite opening 78 of FIG. 3a, and an overlying cover 90 to be pressed on the fence 86 when closing the electrical amplifier apparatus housing. Such cover 90 may be of a metal composition and configuration similar to that of the RF shield 75 of FIG. 3a, but with inside dimensions just very slightly larger than the surrounding fence 86, so that when the cover 90 is placed over the fence 86, a press or interference fit results between the two. The cover 90 can be fabricated, as the fence 86, by a machine-stamping process, and without any need for forming RF shield dividing walls extending downwardly from its underside, as typified the prior art construction of FIGS. 1b or 1c. Thus, if testing or use indicated that a second or third divider wall would be beneficial in the constructions of FIGS. 2a or 3a, this could easily be done without changing any part of the manufacture of the cover 90. Such additional wall or walls would, in accordance with the invention, be spot-welded or otherwise secured in position with the surrounding fence 86,—with each wall having its built-in Y-fold arms at the upper edge surface, with each such Y-fold arm section extending upwardly to physically contact the underside of the cover 90, and with each Y-fold arm section deflecting to ground the wall when the cover is pressed on to close the housing.

It will thus be seen that a new and improved RF shield for electrical apparatus is provided which can be more easily designed and implemented—and which allows for a one-piece gasket/wall design, without the need for having to glue or clamp shielding gaskets at the edges of the internal divider walls employed. It will also be seen that this RF shield could be fabricated through a stamping-machine process, to reduce manufacturing costs substantially below that associated with the conventional die casting methods which characterize the prior art. With the invention, the RF shield could be simply and easily mounted between the various electrical components of the printed circuit board of the electrical apparatus, and provides a new and improved RF shield which can serve as an integral part of the printed circuit board utilized.

While there has been described what is considered to be a preferred embodiment of the present invention, it will be readily appreciated by those skilled in the art that modifications may be made without departing from the scope of the teachings herein of first, an RF shield dividing wall with its own self-contained gasket, by having a metal Y-fold which grounds itself to the metal cover, and second, the RF shield serving as an integral part of the circuit board without any need for a die casting of the parts utilized. For at least such reason, therefore, resort should be had to the claims appended hereto for a true understanding of the scope of the invention.

We claim:

1. In an electrical apparatus of the type including a bottom section having a printed circuit board and components thereon to be divided into separate compartments to reduce electrical interference therebetween, the improvement comprising:

the incorporation in said bottom section of at least one internal metal divider wall of a length positioned to form said separate compartments and to provide RF shielding between the components in the compartments so formed;

with said internal divider wall including upper and lower edge surfaces, with said lower edge surface soldered onto said printed circuit board between said components thereon, with said upper edge surface including along the length thereof a plurality of adjacent upwardly extending Y-fold arms to physically contact an underside of an overlying metal cover section placed to enclose said apparatus;

and with said Y-fold arms being of a metal composition in providing a self-contained RF gasket between said components when enclosed by said overlying metal cover section.

2. The improvement of claim 1 wherein said plurality of adjacent upwardly extending Y-fold arms are of a metal composition to downwardly deflect against said underside of said overlying metal cover section as said cover section is placed to enclose said apparatus.

3. The improvement of claim 2 wherein said plurality of Y-fold arms extend upwardly at an angle of substantially 5°–15° measured from the horizontal.

4. The improvement of claim 1 wherein said internal divider wall also includes opposing side edge surfaces, and wherein there is further included a surrounding fence to an inside surface of which said side edge surfaces of said divider wall are secured.

5. The improvement of claim 4 wherein said surrounding fence includes a plurality of tab locators for aligning said internal divider wall in predetermined placement with said components on said printed circuit board.

6. The improvement of claim 5 for use with an electrical apparatus including a printed circuit board having a plurality of apertures for receiving tab locators in aligning said internal divider wall and fence in said predetermined placement.

7. The improvement of claim 6 wherein said tab locators are of a length to extend through said plurality of apertures to an underside of said printed circuit board.

8. The improvement of claim 4 wherein said surrounding fence is of a configuration and dimension to seat within said overlying cover section of said electrical apparatus in an interference fit.

9. The improvement of claim 8 wherein said surrounding fence and said internal divider wall are fabricated of a steel composition.

10. The improvement of claim 9 wherein said opposing side edge surfaces of said internal divider wall are spot welded to said inside surface of said surrounding fence.

11. In an electrical apparatus of the type including a bottom section having a printed circuit board and components thereon to be divided into separate compartments to reduce electrical interference therebetween, the improvement comprising:

an overlying metal cover section of said apparatus; and at least one internal metal divider wall being positioned to form said separate compartments, a lower edge surface of said internal divider wall being in electrical contact with said printed circuit board and an upper edge surface of said internal divider wall having along the length thereof a plurality of adjacent upwardly extending Y-fold arms contacting an underside of said overlying cover section;

and with said Y-fold arms of a metal composition to provide RF shielding between components in the compartments so formed.

* * * * *